(12) United States Patent
Sato et al.

(10) Patent No.: US 6,660,411 B2
(45) Date of Patent: Dec. 9, 2003

(54) ORGANIC ELECTROLUMINESCENT DEVICE

(75) Inventors: Yoshiharu Sato, Kanagawa (JP); Hideki Sato, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 40 days.

(21) Appl. No.: 09/956,120

(22) Filed: Sep. 20, 2001

(65) Prior Publication Data

US 2002/0055015 A1 May 9, 2002

(30) Foreign Application Priority Data

Sep. 20, 2000 (JP) ........................... 2000-285656
Sep. 20, 2000 (JP) ........................... 2000-285657

(51) Int. Cl.$^7$ ............................................... H05B 33/12
(52) U.S. Cl. ................... 428/690; 428/212; 428/332; 428/917; 427/66; 313/504; 313/506
(58) Field of Search .................. 428/690, 917, 428/212, 332; 313/504, 506; 427/66

(56) References Cited

U.S. PATENT DOCUMENTS

| | | | |
|---|---|---|---|
| 6,010,796 A | * | 1/2000 | Kijima |
| 6,013,384 A | | 1/2000 | Kido et al. |
| 6,121,727 A | | 9/2000 | Kanai et al. |
| 6,306,559 B1 | | 10/2001 | Tanamura et al. |
| 6,440,585 B2 | * | 8/2002 | Tadashi et al. |
| 6,458,475 B1 | * | 10/2002 | Adachi et al. ............ 428/690 |
| 6,486,601 B1 | * | 11/2002 | Sakai et al. |
| 6,509,109 B1 | * | 1/2003 | Nakamura et al. |

FOREIGN PATENT DOCUMENTS

| | | |
|---|---|---|
| EP | 0 855 848 | 7/1998 |
| EP | 0 936 844 | 8/1999 |
| EP | 0 949 696 | * 10/1999 |
| EP | 1 089 361 | 4/2001 |

OTHER PUBLICATIONS

J. Kido, et al., Applied Physics Letters, vol. 73, No. 20, pps. 2866–2868, "Bright Organic Electroluminescent Devices Having a Metal–Doped Electron–Injecting Layer," Nov. 16, 1998.

J. Kido, et al., IEEE Transactions on Electron Devices, vol. 40, No. 7, pps. 1342–1344, "Bright Organic Electroluminescent Devices with Double–Layer Cathode," Jul. 1993.

H. Kanai, et al., Synthetic Metals, vol. 91, pps. 195–196, "Effect of Aromatic Diamines as a Cathode Interface Layer," 1997.

* cited by examiner

*Primary Examiner*—Cynthia H. Kelly
*Assistant Examiner*—Dawn Garrett
(74) *Attorney, Agent, or Firm*—Oblon, Spivak, McClelland, Maier & Neustadt, P.C.

(57) ABSTRACT

An organic electroluminescent device comprising an anode, an organic luminescent layer, an electron transport layer and a cathode formed in this order on a substrate, wherein said electron transport layer contains an electron-transporting material and an alkaline metal, at least a part of said alkaline metal is dispersed in said electron transport layer in the form of cation, and said cathode is made of silver or silver alloy.

23 Claims, 2 Drawing Sheets

8 Cathode
7 Electron transport layer
5 Organic luminescent layer
4 Hole transport layer
3 Anode buffer layer
2 Anode
1 Substrate 8 Cathode
7 Electron transport layer
6 Hole blocking layer
5 Organic luminescent layer
4 Hole transport layer
3 Anode buffer layer
2 Anode
1 Substrate

ORGANIC ELECTROLUMINESCENT DEVICE

FIELD OF THE INVENTION

The present invention relates to an organic electroluminescent device. More particularly, the present invention relates to a thin film device which emits light when an electric field is applied to an organic luminescent layer comprising an organic compound.

BACKGROUND ART

The thin film type electroluminescent (EL) device that has heretofore been used has an inorganic material such as a II–VI group compound semiconductor (e.g., ZnS, CaS and SrS) doped with Mn or rare earth element (e.g., Eu, Ce, Tb, Sm) as an emission center. An EL device prepared from the foregoing inorganic material has the following disadvantages:

1) AC driving is required (50 to 1,000 Hz);
2) A high driving voltage is required (approx. 200 V);
3) The full color arrangement is difficult (particularly for blue color); and
4) The cost of peripheral driving circuit is high.

In recent years, however, an EL device comprising an organic thin layer has been developed to solve the foregoing problems. In particular, in order to enhance the luminous efficiency, the type of electrodes to be used has been optimized for the purpose of enhancing the efficiency of injection of carrier from the electrodes. Further, an organic electroluminescent device comprising a hole transport layer made of an aromatic diamine and an organic luminescent layer made of aluminum complex of 8-hydroxyquinoline has been developed (Appl. Phys. Lett., vol. 51, page 913, 1987). As a result, the luminous efficiency has been drastically enhanced as compared with conventional EL device comprising a single crystal such as anthracene. Further, it has been practiced to dope an aluminum complex of 8-hydroxyquinoline as a host material with a laser fluorescent dye such as coumarin (J. Appl. Phys., vol. 65, page 3610, 1989), thereby enhancing the luminous efficiency or convert the wavelength of emitted light. Thus, these products have been provided with properties close to practical properties.

Besides the foregoing electroluminescent devices comprising low molecular weight materials, an electroluminescent device comprising, as a luminescent layer material, a polymer such as poly(p-phenylenevinylene), poly[2-methoxy-5-(2-ethylhexyloxy)-1,4-phenylenevinylene] and poly(3-alkylthiophene) and a device comprising a mixture of a polymer such as polyvinyl carbazole with a low molecular weight light-emitting material and an electron-transporting material have been developed.

These organic electroluminescent devices are disadvantageous in that they have a low driving stability and require a high driving voltage.

In particular, the lowering of the required driving voltage is one of great problems which must be solved when the organic electroluminescent device is applied to the area of flat panel display. For example, when the organic electroluminescent device is used as a display device for portable devices, a lower consuming power is a particularly great point. Further, when the organic electroluminescent device is applied to small-sized character display device, a simple matrix driving method is mainly employed. In this method, however, the device is required to emit light at a high duty ratio and a high luminance in an extremely short period of time. Thus, a high driving voltage is required, lowering the power emission efficiency.

On the other hand, specific examples of instability during driving include lowering of luminance, rise of voltage during constant current driving, and occurrence of non-emission area (dark spot). There are some causes for these instabilities. It is considered that these instabilities are attributed to deterioration of cathode material, particularly the interface on the organic luminescent layer side thereof. In other words, in the case of organic electroluminescent device, a low work function metal such as magnesium alloy and calcium is used as a cathode to facilitate the injection of electron from the cathode into the organic layer. However, these metals can be easily oxidized due to the moisture in the air and thus become a great cause for instabilities during driving. In other words, a cathode containing a low work function metal is effective for the lowering of the required driving voltage of device but can easily undergo oxidative deterioration and thus needs improvements.

As a cathode material there has been recently used a cathode containing an alkaline metal instead of metal electrode such as magnesium-silver alloy, which has been used at an early stage. This is because that the use of an alkaline metal having a low work function makes the difference from LUMO (lowest empty level) of the organic layer to be small, increasing the amount of electron to be injected into the organic layer and hence making it possible to drive at a low voltage. Thus, an aluminum-lithium alloy is often used at present. However, the content of lithium in aluminum cannot be easily controlled. Further, the aluminum-lithium alloy has a stability problem. Moreover, aluminum, which is a main material of the cathode, has a higher work function than alkaline metal or alkaline earth metal and is relatively stable. Thus, aluminum is often used as a cathode material. However, aluminum can be easily oxidized in the air to become aluminum oxide and lacks storage stability. Thus, the use of silver, which is stabler, as a cathode is under study.

In order to use, as a cathode material, silver which has a high work function and is hardly injected into the organic layer, there have heretofore been proposed a method of vacuum-evaporating Li alone onto an organic compound layer to a thickness as extremely thin as about 10 angstrom, and then depositing silver thereon (IEEE Trans. Electron Devices., vol. 40, page 1342, 1993), a method of depositing silver as a cathode on 4,4'-bis[N-(3-methylphenyl)-N-phenylamino]biphenyl (TPD) or 4,4'-biscarbazolebiphenyl (Cz-TPD) as a cathode buffer layer (Synthetic Metals, vol. 91, page 195, 1997), etc.

However, the two-layer type cathode is limited in the thickness of Li layer and thus cannot perform when the thickness of Li layer is not smaller than 20 angstrom. Therefore, the two-layer type cathode cannot be easily prepared. The method involving the use of TPD or Cz-TPD as a cathode buffer layer is disadvantageous in that the buffer layer itself has a small electron mobility and the required driving voltage must be raised. Thus, this method is not sufficient with respect to the luminous efficiency.

Thus, in order to drive the device at a low voltage, it is necessary that the amount of electron to be injected from the cathode into the organic luminescent layer be increased. On the other hand, in order to prepare a stable device having a high luminous efficiency, it is desirable that silver, which has an excellent stability as cathode material, be used. Accordingly, the study of further improvement of device structure and material for enhancing the efficiency of injection of electron from the cathode made of silver into the organic luminescent layer has been desired.

SUMMARY OF THE INVENTION

The present invention was accomplished under these circumstances. An object of the present invention is to provide an organic electroluminescent device which can emit light at a low voltage and a high efficiency and can be driven in a stable manner.

The gist of the present invention resides in an organic electroluminescent device comprising an anode, an organic luminescent layer, an electron transport layer and a cathode formed in this order on a substrate, wherein the electron transport layer comprises an electron-transporting material and an alkaline metal, at least a part of said alkaline metal is dispersed in the electron transport layer in the form of cation and the cathode comprising silver or a silver alloy; as well as a process for the preparation thereof.

The inventors made extensive studies in order to provide an organic electroluminescent device which can emit light at a low voltage and a high efficiency and can be driven in a stable manner. As a result, it was found that the above objects can be achieved by providing an electron transport layer between the organic luminescent layer and the silver or a silver alloy cathode and using a specific material in the electron transport layer.

The electron transport layer is formed by a compound which can efficiently transport electron injected from the cathode toward the organic luminescent layer between the electrodes across which an electric field is applied. The electron transport layer has an effect of preventing from exciton produced by recombination in the organic luminescent layer from being diffused and quenched in the cathode.

The electron-transporting material to be used in the electron transport layer is required to be a material which can accept electron injected from the cathode at a high efficiency, exhibits a high electron mobility and thus can efficiently transport electron. As materials satisfying these requirements there have been proposed metal complexes such as aluminum complex of 8-hydroxyquinoline. However, these electron-transporting materials generally have a lower charge mobility than hole-transporting materials.

In the present invention, the electron transport layer comprises an alkaline metal incorporated therein in the form of cation in combination with such an electron-transporting material to drastically enhance its charge mobility and receptivity of electron from the cathode. Thus, an organic electroluminescent device can be realized which exhibits an improved efficiency of injection of electron from the cathode comprising silver or a silver alloy, which is highly stable, into the organic luminescent layer, an excellent stability during driving, requires a low driving voltage and exhibits a high luminous efficiency.

In the present invention, a phenanthroline derivative such as bathophenanthroline or a metal complex such as aluminum complex of 8-hydroxyquinoline as the electron-transporting material of the electron transport layer to realize excellent film properties.

Further, by providing a hole blocking layer having an ionization potential which is higher than that of the organic luminescent layer by a factor of 0.1 eV or more between the organic luminescent layer and the electron transport layer, the luminous efficiency of the organic electroluminescent device can be further enhanced.

As the material of the hole blocking layer, it is preferable to use a metal complex, styryl compound, triazole derivative or phenanthroline derivative. The thickness of the hole blocking layer is preferably from 0.5 nm to 50 nm.

The process for the preparation of the organic electroluminescent device of the invention is a process for the preparation of an organic electroluminescent device comprising a step of co-evaporating an alkaline metal obtained by reducing a compound containing an alkaline metal and an electron-transporting material during vacuum deposition to form an electron transport layer. In this manner, an electron transport layer can be efficiently formed which comprises an electron-transporting material and an alkaline metal and has at least a part of the alkaline metal dispersed therein in the form of cation to exhibit remarkably excellent electron-transporting properties.

Figure 1:
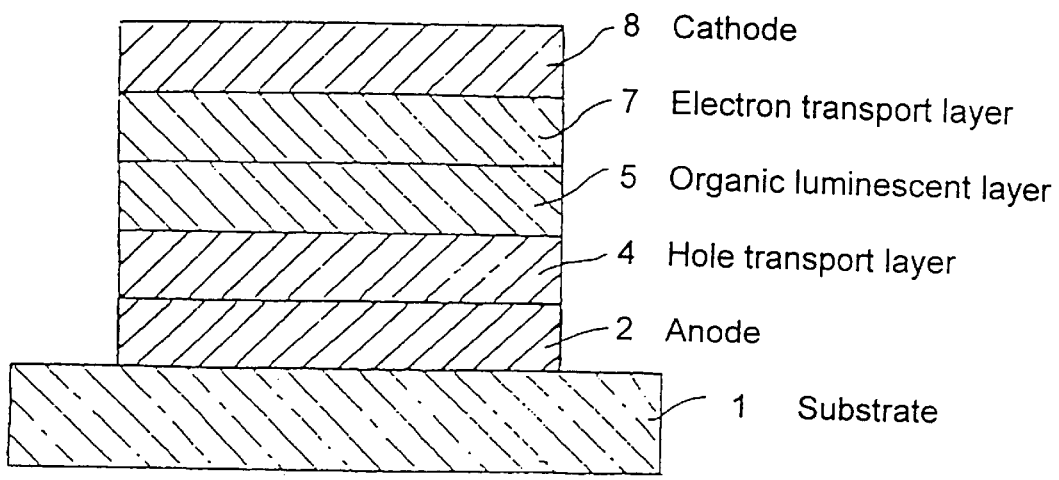
FIG. 1 is a schematic sectional view illustrating an embodiment of the organic electroluminescent device of the invention.

Description of the Reference Numerals and Signs

| | |
|---|---|
| 1 | Substrate |
| 2 | Anode |
| 3 | Anode buffer layer |
| 4 | Hole transport layer |
| 5 | Organic luminescent layer |
| 6 | Hole blocking layer |
| 7 | Electron transport layer |
| 8 | Cathode |

DETAILED DESCRIPTION OF THE INVENTION

Embodiments of the organic electroluminescent device of the present invention will be further described in connection with the attached drawings.

FIGS. 1 to 4 are sectional views schematically illustrating examples of the organic electroluminescent device according to the embodiment of implication of the present invention wherein the reference numeral 1 indicates a substrate, the reference numeral 2 indicates an anode, the reference numeral 3 indicates an anode buffer layer, the reference numeral 4 indicates a hole transport layer, the reference numeral 5 indicates an organic luminescent layer, the reference numeral 6 indicates a hole blocking layer, the reference numeral 7 indicates an electron transport layer, and the reference numeral 8 indicates a cathode.

The substrate 1 acts as a support for the organic electroluminescent device. As the substrate 1 there may be used a quartz or glass plate, a metal plate or foil or a plastic film or sheet. In particular, a glass plate or a plate of a transparent synthetic resin such as polyester, polymethacrylate, polycarbonate and polysulfone is preferred. In the case where such a synthetic resin substrate is used, attention should be paid to the gas barrier properties thereof. When the gas barrier properties of the substrate are too low, the external air which has passed through the substrate can deteriorate the organic electroluminescent device to disadvantage. Thus, it is one of preferred methods to provide a dense silicon oxide layer or the like on at least one side of the synthetic resin substrate and hence secure desired gas barrier properties.

The anode 2 is provided on the substrate 1. The anode 2 plays an role to inject holes into the hole transport layer 4. This anode is formed by a metal such as aluminum, gold, silver, nickel, palladium and platinum, a metal oxide such as indium and/or tin oxide, a halogenated metal such as copper iodide, carbon black, or an electrically-conductive polymer such as poly(3-methylthiophene), polypyrrole and polyaniline. The formation of the anode 2 is usually accomplished by sputtering, vacuum evaporation or the like in most cases. In the case where a particulate metal such as particulate silver, a particulate copper iodide or the like, carbon black, an electrically-conductive particulate metal oxide or an electrically-conductive particulate polymer is used, it may be dispersed in a proper binder resin solution, and then applied to a substrate 1 to form an anode 2. Further, in the case where an electrically-conductive polymer is used, it may be subjected to electrolytic polymerization so that a thin layer is directly formed on the substrate 1. Alternatively, the electrically-conductive polymer may be applied to the substrate 1 to form an anode 2 (Appl. Phys. Lett., vol. 60, page 2711, 1992). The anode 2 may be formed by laminating different materials. The thickness of the anode 2 depends on the required transparency. In the case where transparency is required, the transmittance of the anode 2 with respect to visible light is usually not smaller than 60%, preferably not smaller than 80%. In this case, the thickness of the anode 2 is usually from 5 nm to 1,000 nm, preferably from about 10 nm to 500 nm. In the case where the anode 2 may be opaque, the anode 2 may be the same as the substrate 1. Alternatively, a further electrically-conductive material may be laminated on the foregoing anode 2.

A hole transport layer 4 is provided on the anode 2. The requirements for the material of the hole transport layer 4 are that the material should have a high efficiency of reception of holes from the anode and be capable of efficiently transporting the holes thus injected. Thus, it is required that the material of the hole transport layer 4 have a low ionization potential, a high transparency to visible light, a great hole mobility and an excellent stability and can hardly produce impurities which can act as traps during production or use. The material of the hole transport layer 4 is further required to be free of material which quenches light emitted by the organic luminescent layer. Besides the foregoing requirements, if it is applied to onboard display, the device is required to have heat resistance. Accordingly, as the material of the hole transport layer 4 there is preferably used one having Tg of not lower than 70° C., more preferably not lower than 85° C.

Examples of such a hole-transporting material include aromatic diamine containing two or more tertiary amines and having two or more condensed aromatic rings substituted on nitrogen atom such as 1,1-bis(4-di-p-tolylaminophenyl)cyclohexane and 4,4'-bis[N-(1-naphthyl)-N-phenylamino]biphenyl (JP-A-5-234681/U.S. Pat. No. 5,061,569), aromatic amine compound having a starburst structure such as 4,4',4"-tris(1-naphthylphenylamino) triphenylamine (J. Lumin., vol. 72–74, page 985, 1997), aromatic amine compound comprising a tetramer of triphenylamine (Chem. Commun., page 2175, 1996), aromatic triamine having a phenylenbenzene derivative as a starburst structure (U.S. Pat. No. 4,923,774), compound having a plurality of aromatic diamino groups substituted on pyrenyl group such as N,N'-diphenyl-N,N'-bis(3-methylphenyl) biphenyl-4,4'-diamine, aromatic diamine having a styryl structure (JP-A-4-290851), compound having aromatic tertiary amine units connected to each other with a thiophene group (JP-A-4-304466), starburst type aromatic triamine (JP-A-4-308688/U.S. Pat. No. 5,256,945), compound having tertiary amines connected to each other with a fluorene group (JP-A-5-25473), triamine compound (JP-A-5-239455), bisdipyridylaminobiphenyl, N,N,N-triphenylamine derivative (JP-A-6-1972), aromatic diamine having a phenoxazine structure (JP-A-7-138562), diaminophenylphenantridine derivative (JP-A-7-252474), silazalane compound (U.S. Pat. No. 4,950,950), silanamine derivative (JP-A-6-49079, U.S. Pat. No. 5,358,788), phosphamine derivative (JP-A-6-25659), and spiro compound such as 2,2',7,7'-tetrakis-(diphenylamino)-9,9'-spirobifluorene (Synth. Metal, vol. 91, page 209, 1997). These compounds may be used singly or in admixture of two or more.

Besides the foregoing compounds, a polymer such as polyvinyl carbazole, polyvinyl triphenylamine (JP-A-7-53953) and polyarylene ether sulfone containing tetraphenylbenzidine (Polym. Adv. Tech., vol. 7, page 33, 1996) may be used as the material of the hole transport layer 4.

The hole transport layer 4 may be formed by subjecting the foregoing hole-transporting material to coating or vacuum deposition so that it is laminated on the anode 2.

In the case where coating is employed, one or more hole-transporting materials are optionally mixed with a binder resin or additives such as coatability improver which does not acts as a trap of hole. The mixture is then subjected to dissolution to prepare a coating solution. The coating solution is applied to the anode 2 by the spin coating method, and then dried to form a hole transport layer. Examples of the binder resin employable herein include polycarbonate, polyarylate, and polyester. When the addition amount of the binder resin is too high, the resulting hole mobility is lowered. Thus, the addition amount of the binder resin is preferably smaller, usually not greater than 50% by weight.

In the case of vacuum deposition, the hole-transporting material is put in a crucible placed in a vacuum chamber. The vacuum chamber is evacuated to a pressure of $10^{-4}$ Pa by a proper pump. The crucible is then heated to evaporate the hole-transporting material so that a hole transport layer 4 is formed on the substrate 1 having an anode formed thereon which is disposed opposed to the crucible.

The thickness of the hole transport layer 4 is usually from 10 nm to 300 nm, preferably from 30 nm to 100 nm. In order to form such a thin layer, vacuum evaporation is usually often employed.

An organic luminescent layer 5 is provided on the hole transport layer 4. The organic luminescent layer 5 is formed by a fluorescent compound which undergoes excitation by recombination of hole which has been injected from the anode 2 and migrates through the hole transport layer 4 and electron which has been injected from the cathode 8 and migrates through the electron transport layer 7 between the electrodes across which an electric field is applied to exhibit a strong luminescence.

The fluorescent compound to be used in the organic luminescent layer 5 is required to be a compound which can form a stable thin layer, exhibits a high fluorescence yield in solid form and thus can efficiently transport hole and/or electron. The florescent compound is further required to be a compound which is electrochemically and chemically stable and thus can hardly produce impurities which act as traps during production or use.

Examples of the material satisfying these requirements include metal oxide such as aluminum complex of 8-hydroxyquinoline (JP-A-59-194393, U.S. Pat. No. 4,539, 507), metal complex of 10-hydroxybenzo[h]quinoline (JP-A-6-322362, U.S. Pat. No. 5,529,853), bisstyrylbenzene derivative (JP-A-1-245087, JP-A-2-222484, U.S. Pat. No. 5,069,975), bisstyrylarylene derivative (JP-A-2-247278, U.S. Pat. No. 5,130,603), metal complex of (2-hydroxyphenyl)benzothiazole (JP-A-8-315983, U.S. Pat. No. 5,779,937), and silole derivative. These organic luminescent layer materials are usually laminated on the hole transport layer by vacuum deposition.

Among the foregoing hole transport layer materials, the fluorescent aromatic amine compound may be used as an organic luminescent layer material.

The thickness of the organic luminescent layer 5 is usually from 3 nm to 200 nm, preferably from 5 nm to 100 nm.

The organic luminescent layer 5 can be formed in the same manner as for the hole transport layer 4. In practice, vacuum deposition is preferably used.

For the purpose of enhancing the luminous efficiency of the device and changing the color of emitted light, the device can be doped with a laser fluorescent dye such as coumarin with an aluminum complex of 8-hydroxyquinolione as a host material (J. Appl. Phys., vol. 65, page 3610, 1989). This doping method may be applied also to the organic luminescent layer 5. As the doping material, there may be used any fluorescent dye besides coumarin. Examples of the fluorescent dye which gives blue luminescence include perylene, pyrene, anthracene, and derivative thereof. Examples of green fluorescent dye include quinacridone derivative, and coumarin derivative. Examples of yellow fluorescent dye include rubrene, and perimidone derivative. Examples of red fluorescent dye include benzopyrane derivative, rhodamine derivative, benzothioxanthene derivative, and azabenzothioxanethene.

Besides the foregoing doping fluorescent dyes, fluorescent dyes listed in "*Laser Kenkyu* (Study of Laser)", vol. 8, page 694, page 803, page 958 (1980) vol. 9, page 85 (1981) can be used as doping material for organic luminescent layer depending on the host material.

The amount of the foregoing fluorescent dye with which the device is doped is preferably from $10^{-3}$ to 10% by weight based on the host material.

A process for doping the host material of the organic luminescent layer 5 with the foregoing fluorescent dye will be described below.

In the case where coating is employed, the foregoing host material, a doping fluorescent dye, and optionally a binder resin which does not act as a trap of electron or quencher of emitted light and additives such as coatability improver (e.g., leveling agent) are mixed and dissolved to prepare a coating solution. The coating solution is spin-coated or otherwise applied to the hole transport layer 4, and then dried to form an organic luminescent layer 5. Examples of the binder resin include polycarbonate, polyarylate, and polyester. When the addition amount of the binder resin is too great, the resulting hole/electron mobility is deteriorated. Thus, the addition amount of the binder resin is preferably smaller, more preferably not greater than 50% by weight.

In the case where vacuum deposition is employed, the foregoing host material is put in a crucible placed in a vacuum chamber. A doping fluorescent dye is put in another crucible. The vacuum chamber is then evacuated to a pressure of $10^{-6}$ Torr by a proper vacuum pump. The two crucibles are then simultaneously heated to evaluate the materials so that a layer is formed on a substrate disposed opposed to the crucibles. In accordance with another method, the two materials may be mixed at a predetermined ratio, and then put in a crucible for evaporation.

In the case where the foregoing fluorescent dye as a dopant is doped into the organic luminescent layer, the dopant is diffused in the organic luminescent layer 5 uniformly in the vertical direction. However, there may be a concentration distribution in the vertical direction. For example, the dopant may be diffused in the organic luminescent layer 5 only in the vicinity of the interface with the hole transport layer 4 or only in the vicinity of the interface with the hole blocking layer 6 described later.

An electron transport layer 7 is provided on the organic luminescent layer 5. The electron transport layer 7 may be formed by a compound which can efficiently transport electron injected from the cathode 8 toward the organic luminescent layer 5 between the electrodes across which an electric field is applied. The electron transport layer 7 has an effect of preventing exciton produced by recombination in the organic luminescent layer from being diffused and quenched in the cathode 8.

The electron-transporting material to be used in the electron transport layer 7 needs to be a material which has a high efficiency of reception of electron from the cathode 8 and a high electron mobility and thus can efficiently transport electron injected.

As materials satisfying these requirements there have heretofore been known metal complex such as aluminum complex of 8-hydroxyquinoline (JP-A-59-194393, U.S. Pat. No. 4,539,507), metal complex of 10-hydroxybenzo[h] quinoline, oxadiazole derivative, distyrylbiphenyl derivative, silole derivative, 3-hydroxyflavone metal complex, 5-hydroxyflavone metal complex, benzoxazole metal complex, benzothiazole metal complex, trisbenzimidazolylbenzene (U.S. Pat. No. 5,645,948), quinoxaline compound (JP-A-6-207169), phenanthroline derivative (JP-A-5-331459), 2-t-butyl-9,10-N,N'-dicyanoanthraquinonedimine, etc.

Among these materials, aluminum complex of 8-hydroxyquinoline has a good sublimability and thus can form a layer with excellent properties when vacuum-evaporated. Thus, aluminum complex of 8-hydroxyquinoline has been widely used. However, the electron mobility of aluminum complex of 8-hydroxyquinoline is about two orders less than the hole mobility of the hole-transporting material and thus is not sufficient. Aluminum complex of 8-hydroxyquinoline is not only one material having a low electron mobility. Electron-transporting materials generally have a lower charge mobility than hole-transporting materials.

In the present invention, the electron transport layer 7 comprises an alkaline metal incorporated therein in the form of cation in combination with the electron-transporting layer to have an enhanced charge mobility. Preferred examples of the alkaline metal include sodium, potassium, cesium, lithium, and rubidium. Particularly preferred among these alkaline metals are sodium, potassium, and cesium. Referring to the proportion of the alkaline metal in the form of cation in the electron transport layer 7, the molar ratio of alkaline metal in the form of cation to electron-transporting material in the electron transport layer 7 is preferably from 1:20 to 20:1, more preferably from 1:10 to 10:1. When the proportion of alkaline metal falls below the above defined range, the effect of the invention (sufficient electron mobility) which would be exerted by the introduction of alkaline metal into the electron transport layer may not be sufficiently obtained. On the contrary, when the proportion of alkaline metal exceeds the above defined range, the resulting layer may become unstable, making it more likely that the device could have a deteriorated life.

As the electron-transporting material, there may be used a phenanthroline derivative such as bathophenanthroline or a metal complex of quinoline. As the metal constituting the metal complex of quinoline, there is usually used a divalent to tetravalent metal. A specific example of the metal complex of quinoline is a metal complex such as aluminum complex of 8-hydroxyquinoline. The use of such a compound makes it possible to realize an electron transport layer having excellent properties.

The phenanthroline derivative to be used as an electron-transporting material is a compound having at least one phenanthroline ring represented by the following structural formula:

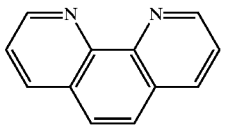

Specific examples of the compound having at least one phenanthroline ring represented by the foregoing structural formula will be given below.

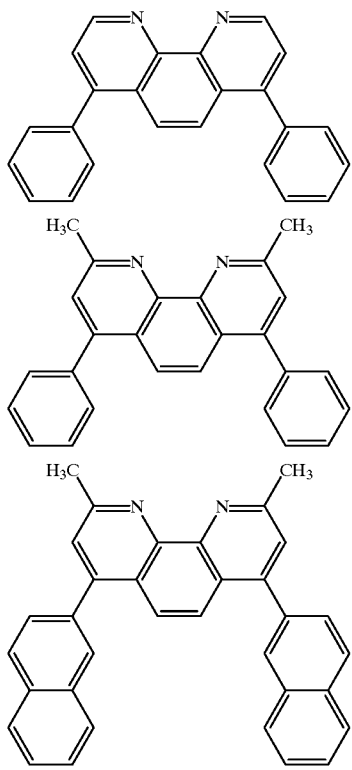

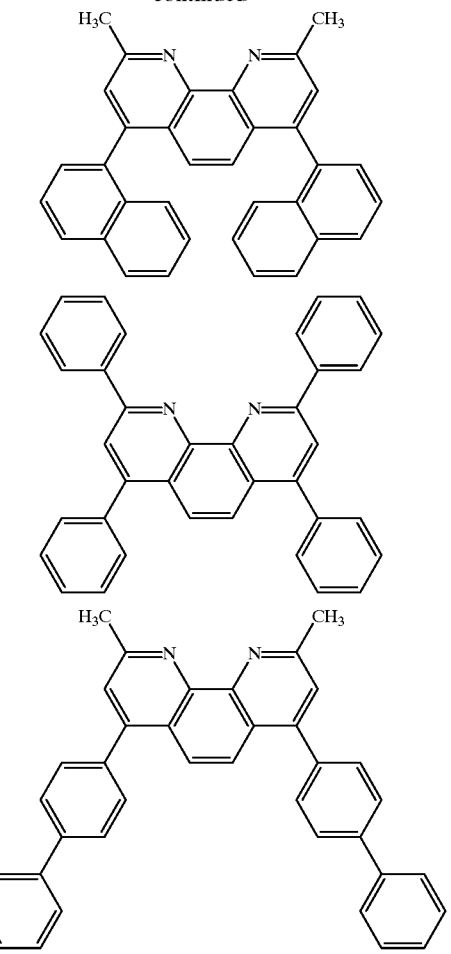

Particularly preferred among these compounds is bathophenanthroline.

Though being not described in the foregoing and following structural formulae, the various aromatic hydrocarbon rings in these compounds may further have substituents. Examples of these substituents include $C_1$–$C_6$ alkyl groups such as methyl, ethyl and butyl, $C_1$–$C_6$ alkoxy groups such as methoxy, ethoxy and butoxy, halogen atoms, and a cyano group.

Specific examples of the metal complex include the following metal complexes, and metal complexes such as mixed ligand complex and binuclear metal complex.

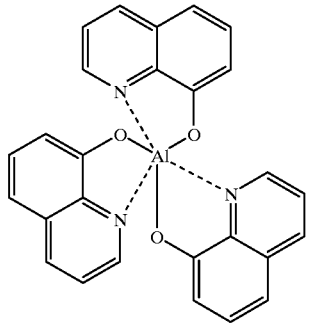

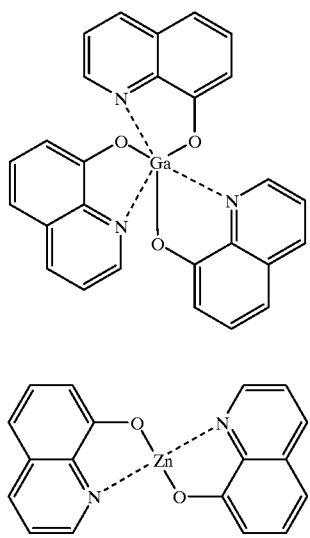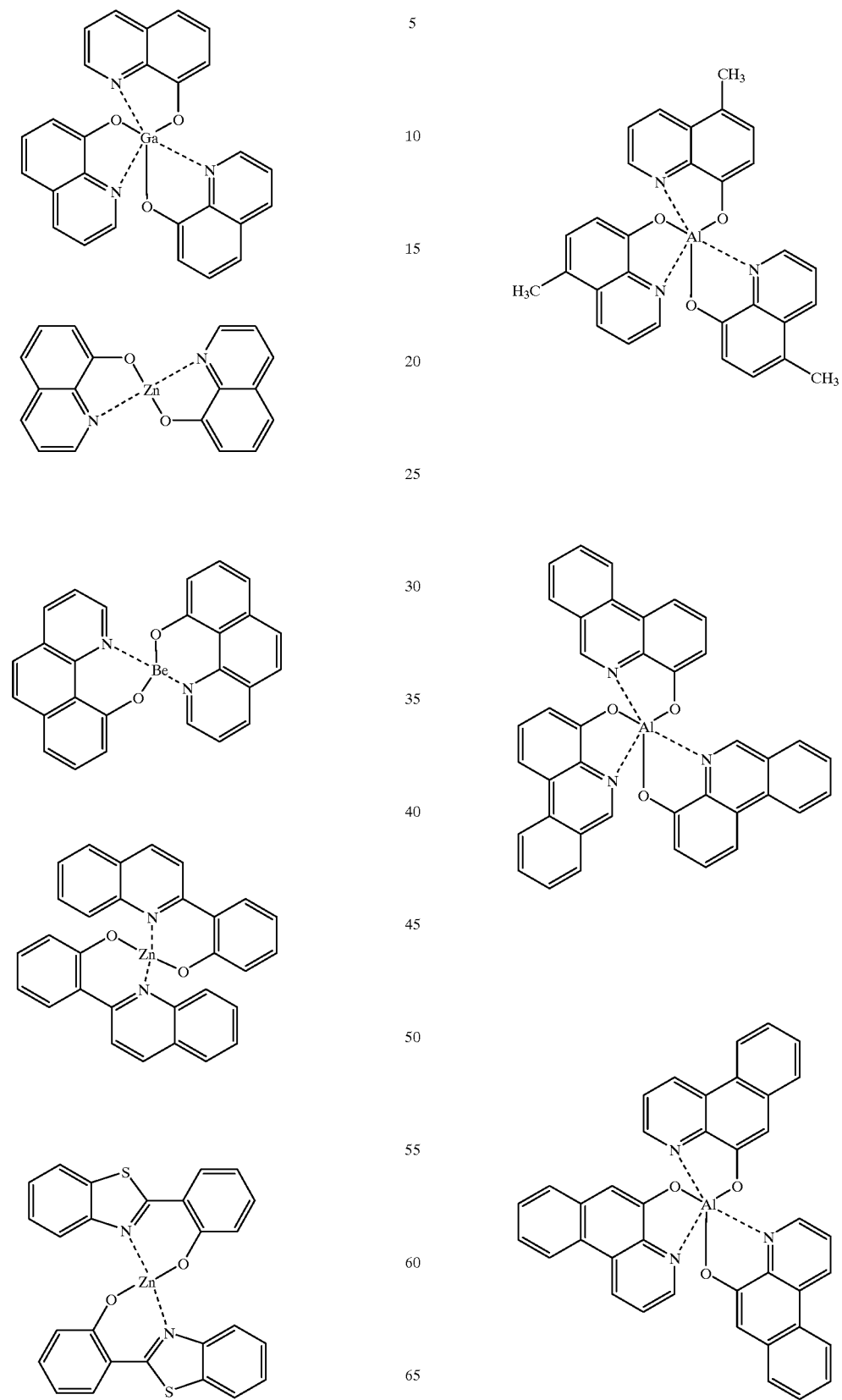

-continued

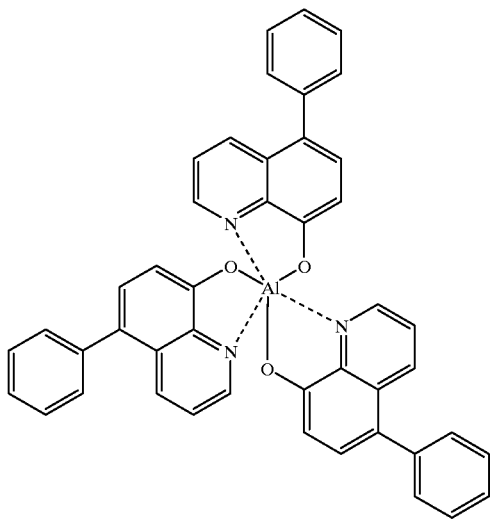

Specific examples of the mixed ligand complex include bis(2-methyl-8-quinolinolato)(phenolato)aluminum, bis(2-methyl-8-quinolinolato)(ortho-cresolato)aluminum, bis(2-methyl-8-quinolinolato)(meta-cresolato)aluminum, bis(2-methyl-8-quinolinolato)(para-cresolato)aluminum, bis(2-methyl-8-quinolinolato)(ortho-phenylphenolato)aluminum, bis(2-methyl-8-quinolinolato)(meta-phenylphenolato) aluminum, bis(2-methyl-8-quinolinolato)(para-phenylphenolato)aluminum, bis(2-methyl-8-quinolinolato)(2,3-dimethylphenolato)aluminum, bis(2-methyl-8-quinolinolato)(2,6-dimethylphenolato)aluminum, bis(2-methyl-8-quinolinolato)(3,4-dimethylphenolato)aluminum, bis(2-methyl-8-quinolinolato)(3,5-dimethylphenolato) aluminum, bis(2-methyl-8-quinolinolato)(3,5-di-tert-butylphenolato)aluminum, bis(2-methyl-8-quinolinolato)(2,6-diphenylphenolato)aluminum, bis(2-methyl-8-quinolinolato)(2,4,6-triphenylphenolato)aluminum, bis(2-methyl-8-quinolinolato)(2,4,6-trimethylphenolato) aluminum, bis(2-methyl-8-quinolinolato)(2,3,6-trimethylphenolato)aluminum, bis(2-methyl-8-quinolinolato)(2,3,5,6-tetramethylphenolato)aluminum, bis(2-methyl-8-quinolinolato)(1-naphtholato)aluminum, bis(2-methyl-8-quinolinolato)(2-naphtholato)aluminum, bis(2-methyl-8-quinolinolato)(triphenylsilanolato)aluminum, bis(2-methyl-8-quinolinolato)(triphenylgermanolato) aluminum, bis(2-methyl-8-quinolinolato)(tris(4,4-biphenyl)silanolato)aluminum, bis(2,4-dimethyl-8-quinolinolato)(ortho-phenylphenolato)aluminum, bis(2,4-dimethyl-8-quinolinolato)(para-phenylphenolato)aluminum, bis(2,4-dimethyl-8-quinolinolato)(meta-phenylphenolato) aluminum, bis(2,4-dimethyl-8-quinolinolato)(3,5-dimethylphenolato)aluminum, bis(2,4-dimethyl-8-quinolinolato)(3,5-di-tert-butylphenolato)aluminum, bis(2-methyl-4-ethyl-8-quinolinolato)(para-cresolato)aluminum, bis(2-methyl-4-methoxy-8-quinolinolato)(para-phenylphenolato)aluminum, bis(2-methyl-5-cyano-8-quinolinolato)(ortho-cresolato)aluminum, bis(2-methyl-6-trifluoromethyl-8-quinolinolato)(2-naphtholato)aluminum, bis(2-methyl-8-quinolinolato)(phenolato)gallium, bis(2-methyl-8-quinolinolato)(ortho-cresolato)gallium, bis(2-methyl-8-quinolinolato)(para-phenylphenolato)gallium, bis(2-methyl-8-quinolinolato)(1-naphtholato)gallium, bis(2-methyl-8-quinolinolato)(2-naphtholato)gallium, bis(2-methyl-8-quinolinolato)(triphenylsilanolato)gallium, and bis(2-methyl-8-quinolinolato)(tris(4,4-biphenyl)silanolato) gallium.

Specific examples of the binuclear metal complex include bis(2-methyl-8-quinolinolato)aluminum-μ-oxo-bis-(2-methyl-8-quinolinolato)aluminum, bis(2,4-dimethyl-8-quinolinolato)aluminum-μ-oxo-bis-(2,4-dimethyl-8-quinolinolato)aluminum, bis(4-ethyl-2-methyl-8-quinolinolato)aluminum-μ-oxo-bis-(4-ethyl-2-methyl-8-quinolinolato)aluminum, bis(2-methyl-4-methoxyquinolinolato)aluminum-μ-oxo-bis-(2-methyl-4-methoxyquinolinolato)aluminum, bis(5-cyano-2-methyl-8-quinolinolato)aluminum-μ-oxo-bis(5-cyano-2-methyl-8-quinolinolato)aluminum, bis(5-chloro-2-methyl-8-quinolinolato)aluminum-μ-oxo-bis-(5-chloro-2-methyl-8-quinolinolato)aluminum, and bis(2-methyl-5-trifluoromethyl-8-quinolinolato)aluminum-μ-oxo-bis-(2-methyl-5-trifluoromethyl-8-quinolinolato)aluminum.

Particularly preferred as an electron-transporting material among these compounds are aluminum complex of 8-hydroxyquinoline, aluminum complex of 2-methyl-8-hydroxyquinoline, and aluminum complex of 10-hydroxybenzo[h]quinoline.

The electron transport layer 7 usually has a thickness of from 5 to 200 nm, preferably from 10 to 100 nm.

The electron transport layer 7 comprising such an electron-transporting material and an alkaline metal in the form of cation can be formed by subjecting these materials to coating or vacuum evaporation in the same manner as for the hole transport layer 4 so that they are deposited on the organic luminescent layer 5. In general, vacuum evaporation is employed.

In the case where vacuum evaporation is employed, the evaporation of the alkaline metal is usually accomplished using an alkaline metal dispenser having a compound containing alkaline metal such as alkaline metal salt of chromic acid and a reducing agent packed in a metal boat. By heating this dispenser in a vacuum chamber, the alkaline metal compound such as alkaline metal salt of chromic acid is reduced so that the alkaline metal is evaporated. The foregoing metal complex to be evaporated together with the alkaline metal is put in a crucible placed in the vacuum chamber. The vacuum chamber is then evacuated to a pressure of $10^{-6}$ Torr by a proper vacuum pump. The crucible and the dispenser are then simultaneously heated to evaporate the materials so that an electron transport layer 7 is formed on a substrate disposed opposed to the crucible and the dispenser.

In this manner, co-evaporation is effected on the electron transport layer 7 uniformly in the vertical direction. However, there may be some distribution of concentration of alkaline metal in the vertical direction.

Figure 2:
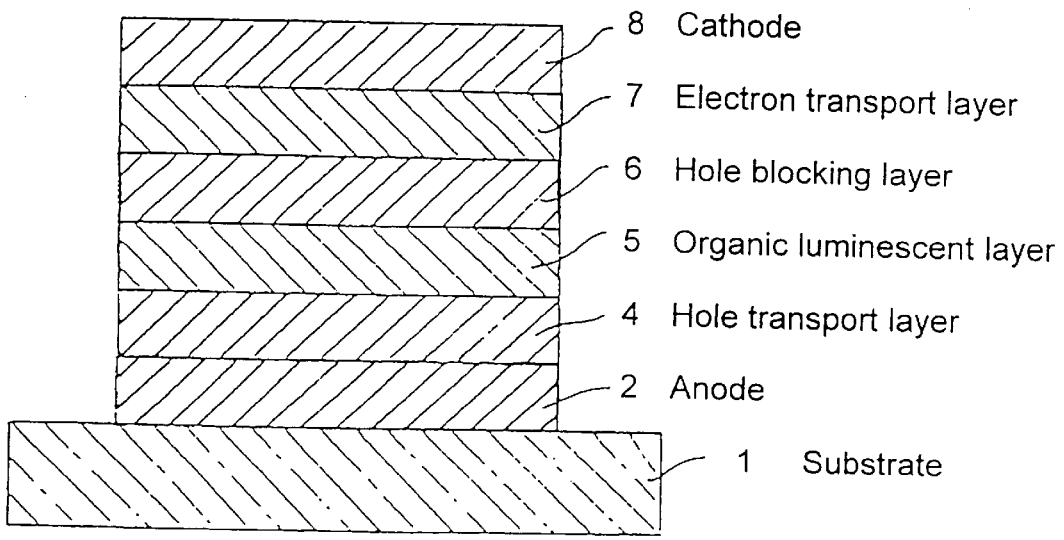
FIG. 2 is a schematic sectional view illustrating another embodiment of the organic electroluminescent device of the invention.
Figure 4:
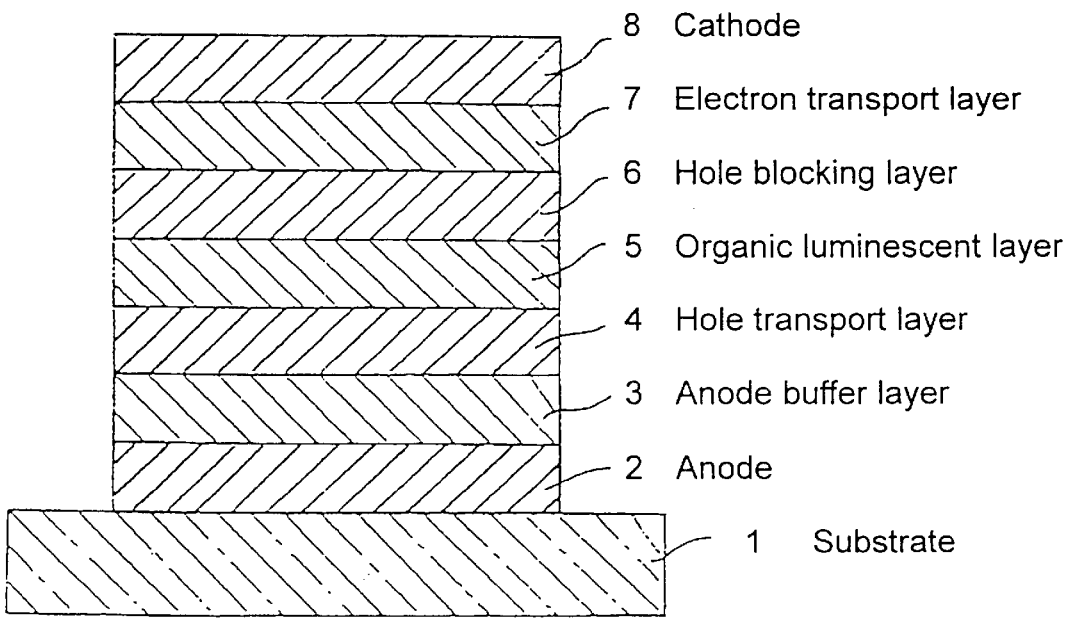
FIG. 4 is a schematic sectional view illustrating a still further embodiment of the organic electroluminescent device of the invention.

In the present invention, for the purpose of further enhancing the luminous efficiency of the device, a hole blocking layer 6 having an ionization potential which is higher than that of the organic luminescent layer by a factor of 0.1 eV or more may be provided between the organic luminescent layer 5 and the electron transport layer 7 as shown in FIGS. 2 and 4. The hole blocking layer 6 is formed by a compound which plays an role to prevent holes which have migrated from the hole transport layer 4 from reaching the cathode 8 and can efficiently transport electron injected from the electron transport layer 7 toward the organic luminescent layer 5. In order to confine exciton produced by recombination in the organic luminescent layer 5 within the organic luminescent layer 5, it is necessary that the compound of the hole blocking layer 6 have a wider band gap than the material of the organic luminescent layer 5. In this case, the band gap is determined by the difference between oxidation potential and reduction potential which is electrochemically determined or optical absorption end. The hole blocking layer 6 is capable of confining both charge carrier and exciton in the organic luminescent layer 5 to enhance the luminous efficiency. The hole blocking layer 6 also plays an role to prevent the alkaline metal in the electron transport layer 7 from being diffused in the organic luminescent layer 5 to deteriorate the luminous efficiency and stability.

Examples of the hole blocking layer material satisfying these requirements include metal complexes such as mixed ligand complex and binuclear metal complex, styryl compounds such as distyrylbiphenyl derivative (JP-A-11-242996), triazole derivatives (JP-A-7-41759, U.S. Pat. No. 5,869,199), and phenanthroline derivatives (JP-A-10-79297, U.S. Pat. No. 6,010,796).

Specific examples of the mixed ligand complex include those exemplified as material of the electron transport layer 7. Particularly preferred among these compounds is bis(2-methyl-8-quinolinolato)(triphenylsilanolato)aluminum.

Specific examples of the binuclear metal complex include those exemplified as material of the electron transport layer 7. Particularly preferred among these compounds is bis(2-methyl-8-quinolinolato)aluminum-$\mu$-oxo-bis-(2-methyl-8-quinolinolato)aluminum.

Specific examples of the styryl compound to be used as a hole blocking material include the following distyrylarylene derivatives.

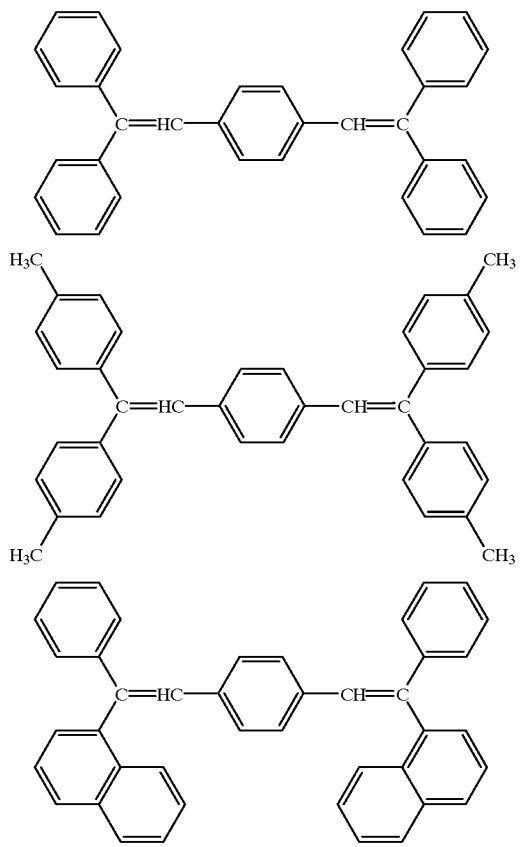

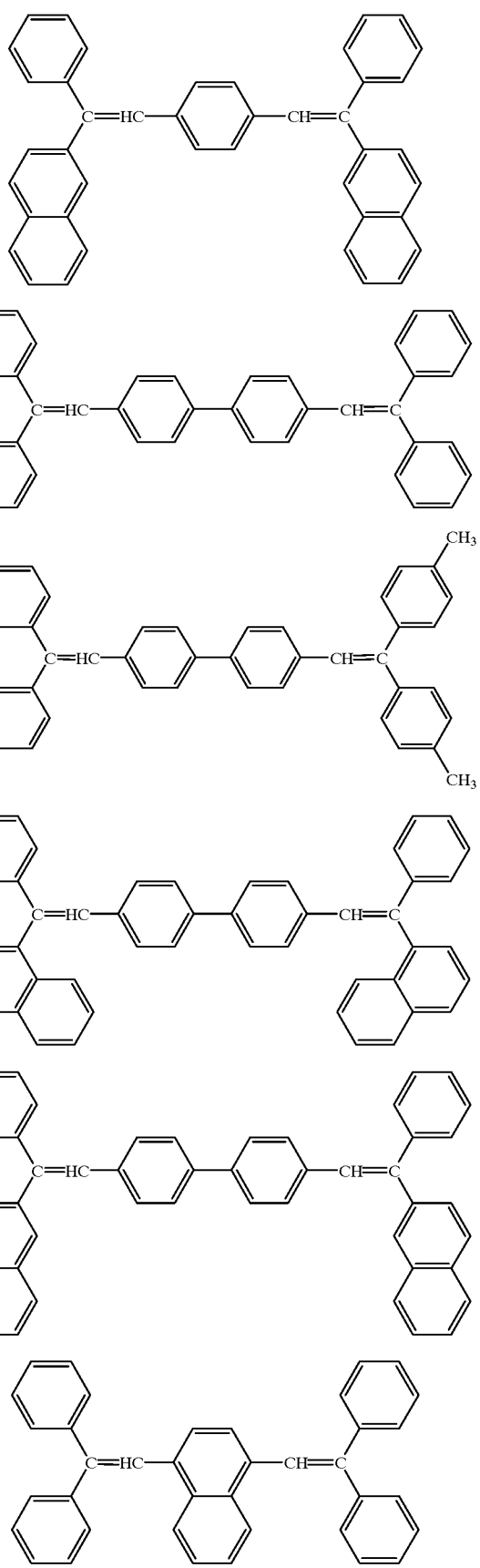

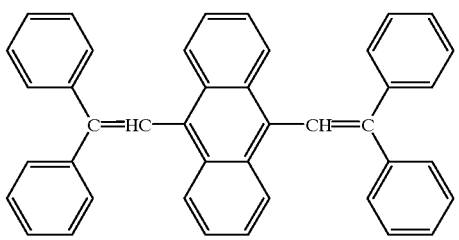

As the triazole derivative, there may be used a compound having at least one 1,2,4-triazole ring residue represented by the following structural formula.

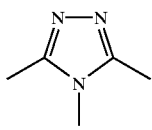

Specific examples of the compound having at least one 1,2,4-triazole ring residue represented by the foregoing structural formula will be given below.

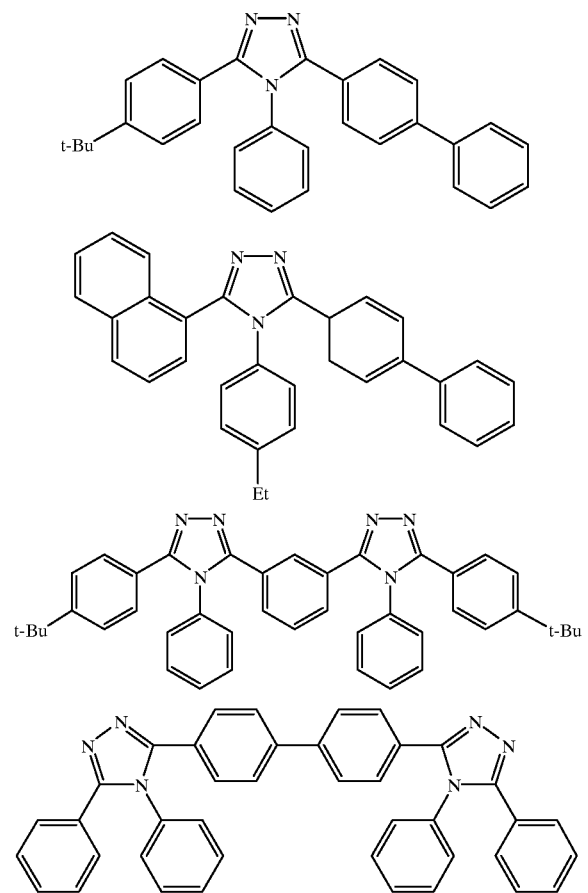

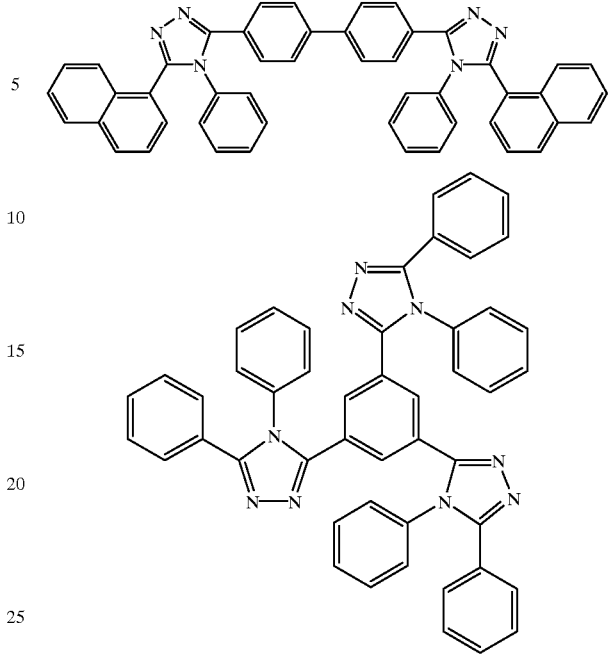

Though not shown in these structural formulae, the foregoing various exemplified distyrylarylene derivatives and triazole derivatives may have substituent(s) on the aromatic ring. Examples of the substituents on the aromatic ring include $C_1$–$C_6$ alkyl groups such as methyl, ethyl and butyl, $C_1$–$C_6$ alkoxy groups such as methoxy, ethoxy and butoxy, halogen atoms, and a cyano group.

Specific examples of the phenanthroline derivative to be used as a hole blocking material include those exemplified as a material of the electron transport layer material. Particularly preferred among these compounds is bathocuproine. These compounds may be used singly or in admixture of two or more thereof as necessary.

The hole blocking layer 6 usually has a thickness of from 0.3 nm to 100 nm, preferably from 0.5 nm to 50 nm.

The hole blocking layer 6 may be formed in the same manner as the hole transport layer 4 but is usually formed by vacuum deposition method.

The cathode 8 acts to inject electron into the electron transport layer 7. In the invention, silver is used as the material of the cathode 8. In the invention, however, it is not necessarily required that the cathode be formed by pure silver. A silver alloy containing other metals may be used so far as the stability (corrosion resistance), which is the effect of the invention, cannot be impaired. The content of the other metals, if any, to be incorporated in the silver alloy is usually not greater than 50% by weight, preferably from 0.1 to 30% by weight. As the other metals there may be used any of metals which are inert to atmosphere and are usually used as electrode, e.g., Al, Cu, Ni, Au, Pt. When the content of these metals exceeds the above defined range, the stability of the cathode may be impaired. On the contrary, when the content of these metals falls below the above defined range, the effect of reducing cost or like effects which would be exerted by the use of the other metals may not be obtained.

The cathode 8 made of silver or silver alloy is usually formed by vacuum deposition method.

Figure 3:
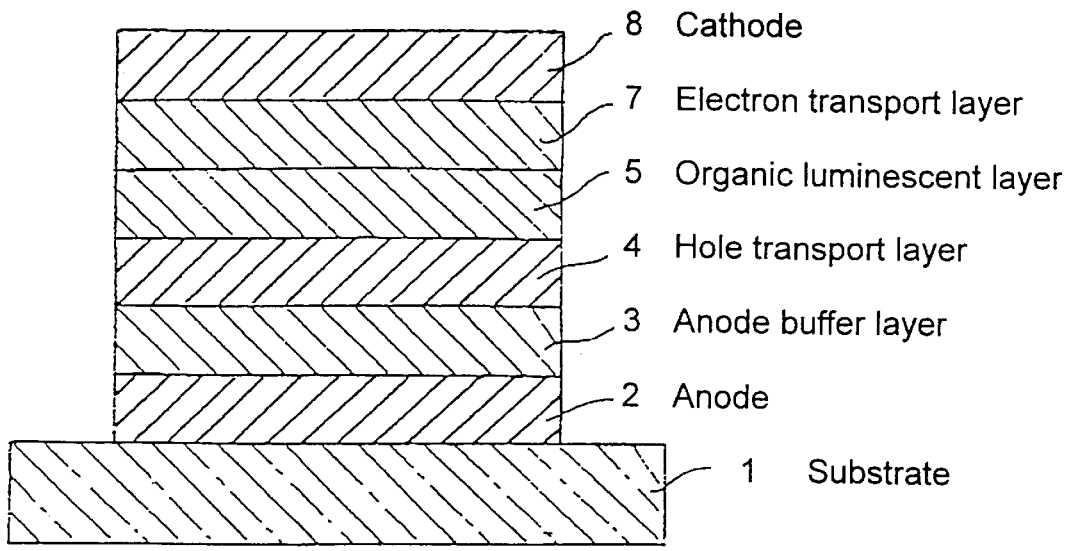
FIG. 3 is a schematic sectional view illustrating a further embodiment of the organic electroluminescent device of the invention.

In the invention, an anode buffer layer 3 may be provided interposed between the hole transport layer 4 and the anode 2 as shown in FIGS. 3 and 4 for the purpose of further enhancing the efficiency of injection of hole and improving the adhesivity of the entire organic layer to the anode 2. The interposition of the anode buffer layer 3 makes it possible to exert an effect of lowering the initial driving voltage of the device as well as inhibiting the rise of voltage developed when the device is continuously driven at a constant current. The material of the anode buffer layer is required to make a good contact with the anode to form a uniform thin layer and have a high thermal stability, i.e., high melting point and glass transition temperature. The material of the anode buffer layer is required to have a melting point of not lower than 300° C. and a glass transition temperature of not lower than 100° C. The material of the anode buffer layer is further required to have so low an ionization potential that holes can be easily injected from the anode 2 and a high hole mobility.

There have been reported organic compounds such as porphyrin derivative and phthalocyanine compound (JP-A-63-295695, U.S. Pat. No. 4,720,432), hydrazone compound, alkoxy-substituted aromatic diamine derivative, p-(9-anthryl)-N,N-di-p-tolylaniline, polythienylenevinylene, poly-p-phenylenevinylene and polyaniline (Appl. Phys. Lett., vol. 64, page 1,245, 1994), polythiophene (Optical Materials, vol. 9, page 125, 1998) and starburst type aromatic triamine (JP-A-4-308688, U.S. Pat. No. 5,256,945), sputtered carbon layer (Synth. Met., vol. 91, page 73, 1997), and metal oxides such as vanadium oxide, ruthenium oxide and molybdenum oxide (J. Phys. D, vol. 29, page 2750, 1996).

Examples of the compound which may be used often as material of the anode buffer layer 3 include porphyrin compound and phthalocyanine compound. These compounds may have a central metal or may be metal-free. Specific examples of these compounds include porphyrin, 5,10,15,20-tetraphenyl-21H,23H-porphyrin, 5,10,15,20-tetraphenyl-21H,23H-porphyrin cobalt (II), 5,10,15,20-tetraphenyl-21H,23H-porphyrin copper (II), 5,10,15,20-tetraphenyl-21H,23H-porphyrin zinc (II), 5,10,15,20-tetraphenyl-21H,23H-porphyrin vanadium (IV) oxide, 5,10,15,20-tetra(4-pyridyl)-21H,23H-porphyrin, 29H,31H-phthalocyanine, copper (II) phthalocyanine, zinc (II) phthalocyanine, titanium phthalocyanine oxide, magnesium phthalocyanine, lead phthalocyanine, and copper (II) 4,4',4'',4'''-tetraaza-29H,31H-phthalocyanine.

The anode buffer layer 3 may be formed to a small thickness in the same manner as the hole transport layer 4. In the case where the anode buffer layer 3 is made of inorganic material, sputtering process, electron beam evaporation method, plasma CVD method or the like may be used.

The thickness of the anode buffer layer 3 thus formed is usually from 3 to 200 nm, preferably from 10 to 100 nm.

The organic electroluminescent device shown in FIGS. 1 to 4 is merely an embodiment of implication of the present invention, but the present invention is not limited thereto. For example, a structure opposite to that shown in FIG. 1 may be used. In other words, a cathode 8, an electron transport layer 7, an organic luminescent layer 5, a hole transport layer 4, and an anode 2 may be deposited on the substrate in this order. As already mentioned, an organic electroluminescent device of the invention may be provided interposed between two sheets of substrates at least one of which has a high transparency. Similarly, in FIGS. 2 to 4, the order of lamination of various layers may be reversed.

Besides the foregoing anode buffer layer 3, hole transport layer 4 and hole blocking layer 6, an arbitrary layer may be provided between the anode 2 and the organic luminescent layer 5, between the organic luminescent layer and the electron transport layer 7 and between the electron transport layer 7 and the cathode 8.

The foregoing organic electroluminescent device of the invention can be used in the form of single device, array of devices or X-Y matrix of anode and cathode.

In accordance with the invention, the use of silver or silver alloy, which is highly stable, as a cathode material and the provision of an electron transport layer containing an alkaline metal having a high electron transporting capacity make it possible to provide an organic electroluminescent device having an excellent stability which can receive electron efficiently to cause efficient recombination of hole and electron in the organic luminescent layer and hence give a high luminous efficiency. In particular, the use of a specific electron-transporting material makes it possible to improve the quality of the electron transport layer and hence further enhance the efficiency of injection of electron. Further, the introduction of a hole blocking layer makes it possible to prevent the alkaline metal in the electron transport layer from being diffused in the organic luminescent layer and hence provide a device having a high luminous efficiency and a high stability.

The present invention will be further described in the following examples and comparative examples, but the present invention should not be construed as being limited thereto.

EXAMPLE 1

An organic electroluminescent device having the structure shown in FIG. 3 was prepared in the following manner.

A glass substrate 1 having an indium-tin oxide (ITO) transparent electrically-conductive layer deposited thereon to a thickness of 120 nm (electron beam-formed product produced by GEOMATEC Co., Ltd.; sheet resistivity: 15Ω) was subjected to ordinary photolithography and etching with hydrochloric acid so that it was patterned with stripes having a width of 2 mm to form an anode 2. The ITO substrate thus patterned was subjected to ultrasonic cleaning with acetone, washing with pure water and ultrasonic cleaning with isopropyl alcohol, blown with nitrogen to dryness, subjected to ultraviolet ozone cleaning, and then put in a vacuum deposition machine. The vacuum deposition machine was roughly evacuated by an oil rotary pump, and then further evacuated by an oil diffusion pump provided with a liquefied nitrogen trap until the degree of vacuum in the vacuum chamber reached not greater than $2 \times 10^{-6}$ Torr (approx. $2.7 \times 10^{-4}$ Pa).

As the material of anode buffer layer 3, there was used copper phthalocyanine (HI-1) having the following structural formula. The copper phthalocyanine was vacuum-deposited on the anode 2 at a rate of 0.2 nm/sec under a pressure of $1.4 \times 10^{-6}$ Torr (approx. $1.9 \times 10^{-4}$ Pa) so that an anode buffer layer 3 was formed to a thickness of 10 nm.

(HI-1)

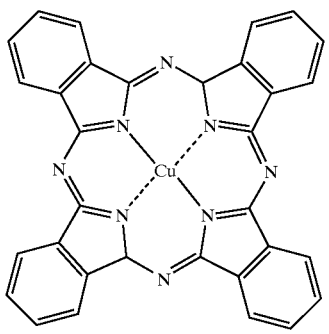

As the material of hole transport layer 4, there was used 4,4'-bis[(N-(1-naphthyl)-N-phenylamino]biphenyl (HT-1) having the following structural formula. This material was then put in a ceramic crucible. The ceramic crucible was then heated by a tantalum wire heater provided therearound to cause vacuum deposition. During this procedure, the temperature of the crucible was controlled to a range of from 255° C. to 270° C. The vacuum deposition was effected at a rate of 0.2 nm/sec under a pressure of $1.1 \times 10^{-6}$ Torr (approx. $1.5 \times 10^{-4}$ Pa). As a result, a hole transport layer 4 was formed to a thickness of 60 nm.

(HT-1)

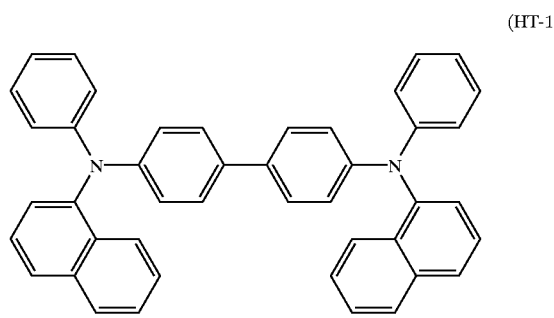

Subsequently, as a material of the organic luminescent layer 5, a 8-hydroxyquinoline complex of aluminum (EM-1) having the following structural formula was vacuum-deposited on the foregoing hole transport layer 4 in the same manner as mentioned above. During this procedure, the temperature of the crucible was controlled to a range of from 310° C. to 315° C. The vacuum deposition was effected at a rate of 0.2 nm/sec under a pressure of $1.1 \times 10^{-6}$ Torr (approx. $1.5 \times 10^{-4}$ Pa). As a result, an organic luminescent layer 5 was formed to a thickness of 30 nm.

(EM-1)

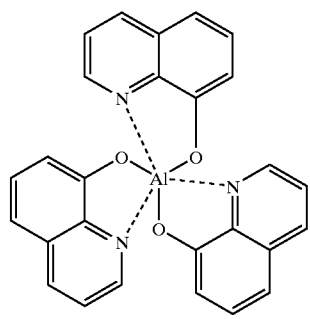

The substrate was kept at room temperature between the vacuum deposition of anode buffer layer 3 and the vacuum deposition of organic luminescent layer 5.

The device having an organic luminescent layer 5 vacuum-deposited thereon was then withdrawn from the vacuum chamber so that it was exposed to atmosphere. The device was then put in another vacuum chamber with a shadow mask patterned with stripes having a width of 2 mm as an evaporation mask brought in contact therewith in such an arrangement that these stripes cross ITO stripes in the anode 2. The vacuum chamber was then evacuated in the same manner as for the organic luminescent layer until the pressure in the vacuum chamber reached not greater than $2.5 \times 10^{-6}$ Torr (approx. $3.3 \times 10^{-4}$ Pa).

Subsequently, as materials of electron transport layer 7, a phenanthroline derivative having the following structural formula (ET-1) and sodium were together vacuum-deposited on the foregoing organic luminescent layer 5 at a molar ratio of 50:50 in the same manner as mentioned above. For the vacuum deposition of sodium, a sodium dispenser (produced by SAES Getters Inc.) having sodium chromate was used. During this procedure, the temperature of the crucible and the current flowing in the dispenser were controlled to a range of from 240° C. to 280° C. and from 4A to 5A, respectively. The vacuum deposition was effected at a rate of 0.1 nm/sec for the phenanthroline derivative (ET-1) under a pressure of $2.6 \times 10^{-6}$ Torr (approx. $3.5 \times 10^{-4}$ Pa). The total thickness of the deposit was 45 nm.

(ET-1)

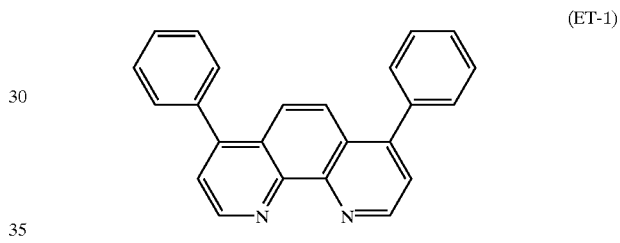

Subsequently, a cathode 8 was formed by vacuum-depositing silver from a molybdenum boat onto the electron transport layer 7 to a thickness of 80 nm at a rate of 0.5 nm/sec under a pressure of $1.0 \times 10^{-5}$ Torr (approx. $1.3 \times 10^{-3}$ Pa). During the vacuum deposition of electron transport layer 7 and cathode 8, the substrate was kept at room temperature.

In this manner, an organic electroluminescent device having a luminescent area of 2 mm×2 mm was prepared. The luminescent characteristics of the organic electroluminescent device are set forth in Table 1. In Table 1, maximum luminance represents the value at a current density of 250 mA/cm², luminous efficiency represents the value at 100 cd/m², luminance/current represents the gradient of luminance-current density curve, and voltage represents the value at 100 cd/m².

The device thus prepared showed no remarkable rise of driving voltage and no drop of luminous efficiency and luminance even after a prolonged storage. Thus, the device showed a high storage stability. Further, even after 96 hours of storage at a temperature of 60° C. and a humidity of 90%, the device showed a practically acceptable change of luminescent characteristics.

The interior of the electron transport layer was then identified for state of sodium by X-ray diffraction. As a result, it was confirmed that most of sodium thus deposited had been in the form of cation.

EXAMPLE 2

A device shown in FIG. 4 was prepared in the same manner as in Example 1 except that a hole blocking layer 6

(thickness: 10 nm) was provided interposed between the organic luminescent layer 5 and the electron transport layer 7 and the thickness of the electron transport layer 7 was changed to 35 nm. As the material of the hole blocking layer 6 there was used a 8-hydroxyquinoline complex of silanol aluminum having the following structural formula (HB-1).

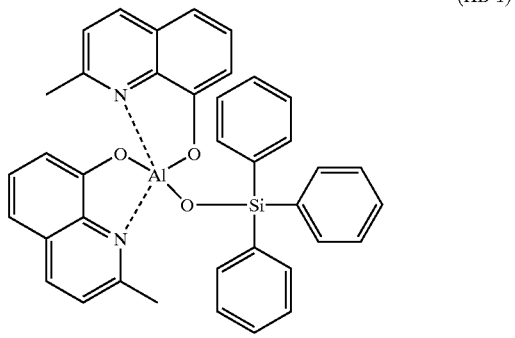

(HB-1)

During the formation of hole blocking layer, the temperature of the crucible was controlled to a range of from 270° C. to 280° C. The vacuum deposition of hole blocking layer was effected at a rate of 0.2 nm/sec under a pressure of $1.0 \times 10^{-6}$ Torr (approx. $1.3 \times 10^{-4}$ Pa). The luminescent characteristics of the device are set forth in Table 1.

The foregoing device showed a low voltage at 100 cd/m² similarly to that of Example 1.

Comparative Example 1

A device was prepared in the same manner as in Example 1 except that as the material of electron transport layer there was used only the same 8-hydroxyquinoline complex of aluminum (EM-1) as used in the organic luminescent layer and as the cathode there was used a three-layer cathode obtained by sequentially vacuum-depositing magnesium fluoride ($MgF_2$:1.5 nm), aluminum (40 nm) and silver (40 nm). The luminescent characteristics of the device thus prepared are set forth in Table 1.

The device thus prepared showed a rise of voltage at 100 cd/m² as compared with those of Examples 1 and 2.

TABLE 1

| | Maximum luminance [cd/m²' at 250 A/cm² | Luminous efficiency [1 m/W] at 100 cd/m² | Luminance/ current [cd/A] | Voltage [V] at 100 cd/m² |
| --- | --- | --- | --- | --- |
| Example 1 | 7,500 | 2.5 | 3.2 | 4.0 |
| Example 2 | 6,280 | 1.9 | 2.6 | 4.3 |
| Comparative Example 1 | 8,030 | 2.0 | 3.5 | 5.5 |

As mentioned in detail above, the organic electroluminescent device of the invention comprises a stable silver or silver alloy cathode and an electron transport layer showing a high electron transporting capacity and thus can provide a device which exhibits a high storage stability and can emit light at a high efficiency.

Accordingly, the organic electroluminescent device according to the invention can be applied to flat panel display (e.g., for OA computer, wall-mounted TV, onboard display, outdoor display), multi-color display, light source making the best use of characteristics of planar light emitter (e.g., light source for copying machine, backlight source for liquid crystal display or measuring instrument), display panel, signal lamp, etc. The organic electroluminescent device according to the invention exhibits a great technical value particularly when applied to light source requiring a high light emission efficiency or simple matrix display.

While the invention has been described in detail and with reference to specific embodiments thereof, it will be apparent to one skilled in the art that various changes and modifications can be made therein without departing from the spirit and scope thereof.

This application is based on Japanese patent applications No. 2000-285656, filed Sep. 20, 2000 and No. 2000-285657, filed Sep. 20, 2000, the entire contents thereof being hereby incorporated by reference.

What is claimed is:

1. An organic electroluminescent device comprising an anode, an organic luminescent layer, an electron transport layer and a cathode formed in this order on a substrate, wherein said electron transport layer contains an electron-transporting material and an alkaline metal, at least a part of said alkaline metal is dispersed in said electron transport layer in the form of cation, and said cathode is made of silver or silver alloy.

2. The organic electroluminescent device according to claim 1, wherein said electron-transporting material is a phenanthroline derivative or a metal complex.

3. The organic electroluminescent device according to claim 2, wherein said electron-transporting material is bathophenanthroline.

4. The organic electroluminescent device according to claim 1, wherein said alkaline metal in said electron transport layer comprises at least one alkaline metal selected from the group consisting of sodium, potassium, cesium, lithium and rubidium.

5. The organic electroluminescent device according to claim 1, wherein said alkaline metal in said electron transport layer comprises at least one alkaline metal selected from the group consisting of sodium, potassium and cesium.

6. The organic electroluminescent device according to claim 1, wherein the molar ratio of electron-transporting material to alkaline metal in the form of cation in said electron transport layer is from 1:10 to 10:1.

7. The organic electroluminescent device according to claim 1, wherein said cathode comprises silver.

8. The organic electroluminescent device according to claim 1, wherein said cathode comprises a silver alloy which contains one or more metals selected from the group consisting of Al, Cu, Ni, Au and Pt.

9. The organic electroluminescent device according to claim 8, wherein the content of metals other than silver in said cathode is not greater than 50% by weight.

10. The organic electroluminescent device according to claim 1, which further comprises a hole blocking layer interposed between said organic luminescent layer and said electron transport layer and said hole blocking layer exhibits an ionization potential of 0.1 eV or more greater than that of said organic luminescent layer.

11. The organic electroluminescent device according to claim 10, wherein said hole blocking layer comprises a metal complex, a styryl compound, a triazole derivative or a phenanthroline derivative.

12. The organic electroluminescent device according to claim 10 wherein said hole blocking layer has a thickness of from 0.5 to 50 nm.

13. The organic electroluminescent device according to claim 10, wherein hole blocking layer comprises at least one compound selected from the group consisting of bis(2-methyl-8-quinolinolato)(triphenylsilanolato)aluminum, bis(2-methyl-8-quinolinolato)aluminum-$\mu$-oxo-bis-(2-methyl-8-quinolinolato)aluminum and distyrylarylene derivative.

14. The organic electroluminescent device according to claim 1, wherein said organic luminescent layer has a thickness in the range of from not smaller than 5 nm to not greater than 100 nm.

15. The organic electroluminescent device according to claim 1, wherein said organic luminescent layer comprises at least one compound selected from the group consisting of metal complex of 8-hydroxyquinoline, metal complex of 10-hydroxybenzo[h] quinoline, bisstyrylbenzene derivative, bisstyrylarylene derivative, metal complex of (2-hydroxyphenyl)benzothiazole and silole derivative.

16. The organic electroluminescent device according to claim 1, which further comprises a hole transport layer interposed between said anode and said organic luminescent layer.

17. The organic electroluminescent device according to claim 16, wherein said hole transport layer comprises an aromatic amine compound.

18. The organic electroluminescent device according to claim 16, wherein said hole transport layer has a thickness in the range of from not smaller than 30 nm to not greater than 100 nm.

19. The organic electroluminescent device according to claim 16, which further comprises an anode buffer layer interposed between said anode and said hole transport layer.

20. The organic electroluminescent device according to claim 19, wherein said anode buffer layer comprises a porphyrin compound or phthalocyanine compound.

21. The organic electroluminescent device according to claim 19, wherein said anode buffer layer has a thickness in the range of from not smaller than 10 nm to not greater than 100 nm.

22. An organic electroluminescent device comprising an anode, an anode buffer layer, a hole transport layer, an organic luminescent layer, a hole blocking layer, an electron transport layer and a cathode formed in this order on a substrate, wherein
said electron transport layer comprises an electron-transporting material and an alkaline metal,
at least a part of said alkaline metal is dispersed in said electron transport layer in the form of cation, and said cathode comprises silver or a silver alloy.

23. A process for the preparation of an organic electroluminescent device comprising:
a step of co-evaporating an alkaline metal obtained by reducing a compound containing an alkaline metal and an electron-transporting material in a metal deposition machine to form an electron transport layer.

* * * * *